United States Patent [19]

Okada et al.

[11] 4,246,500
[45] Jan. 20, 1981

[54] CURRENT MIRROR CIRCUIT

[75] Inventors: Yutaka Okada, Kokubunji; Tohru Nakamura, Houya; Takahiro Okabe, Hinodemachi, all of Japan

[73] Assignee: Hitachi, Ltd., Japan

[21] Appl. No.: 7,654

[22] Filed: Jan. 29, 1979

[30] Foreign Application Priority Data

Feb. 3, 1978 [JP] Japan .................. 53/11527[U]

[51] Int. Cl.$^3$ .................. H03K 19/08; H03K 19/20
[52] U.S. Cl. .................. 307/299 B; 307/255; 307/296 R; 307/303; 357/92
[58] Field of Search .............. 307/299 B, 296, 255, 307/303; 352/92; 330/257, 289, 255

[56] References Cited

U.S. PATENT DOCUMENTS

| 3,566,154 | 2/1971 | Loessi | 307/299 B |
| 3,633,052 | 1/1972 | Hanna | 307/299 B |
| 3,872,323 | 3/1975 | Frederiksen et al. | 330/257 |
| 4,140,920 | 2/1979 | Dao et al. | 307/299 B |

OTHER PUBLICATIONS

IBM Tech. Dsclre. Bttn., Regulated Power Supply for MTL Integrated Circuits by R. C. Jaeger, vol. 18, No. 4, 9/75, pp. 1220–1222.

Primary Examiner—Stanley D. Miller, Jr.
Assistant Examiner—B. P. Davis
Attorney, Agent, or Firm—Craig & Antonelli

[57] ABSTRACT

A current mirror circuit wherein an I²L circuit is employed as the load of a current mirror circuit formed of a PNP (NPN) transistor, the injector of the I²L circuit is common with those of another group of I²L circuits, and a predetermined current is derived from the PNP (NPN) transistor of the current mirror circuit.

5 Claims, 7 Drawing Figures

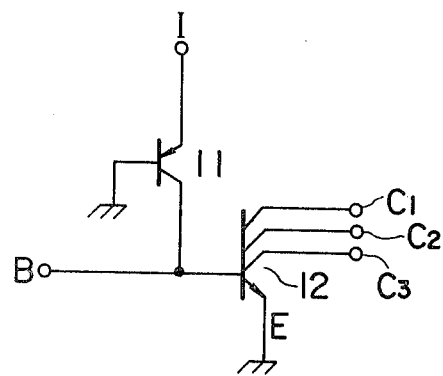
FIG. IA
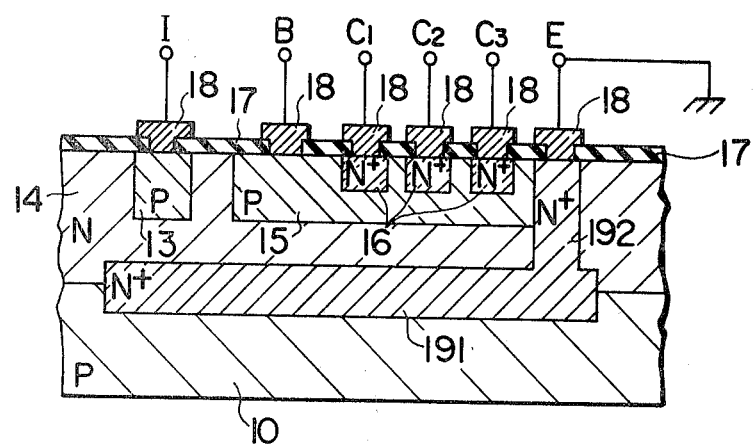
FIG. IB

CURRENT MIRROR CIRCUIT

BACKGROUND OF THE INVENTION

1. Field of the Invention

The present invention relates to a semiconductor integrated circuit and, more particularly, to a current mirror circuit. Especially, the invention is directed to a current mirror circuit which employs an integrated injection logic circuit ($I^2L$).

2. Description of the Prior Art

The $I^2L$ circuit is a new logical circuit which was described, for example, in a published article by H. H. Benger and S. K. Wiedman: Merged-Transistor Logic (MTL)—A Low-Cost Bipolar Logic Concept; IEEE J. of SSC, sc-7, 5, pgs 340–346 (1972, Oct.), and a publication by K. Hart and A. Slob: Integrated Injection Logic: A New Approach to LSI; IEEE J. of SSC, sc-7, 5, pgs 346–351 (1972, Oct.). The $I^2L$ circuit has attracted attention for such reasons as capability of a high density of integration, wide application, and capability of coexistence with conventional bipolar transistors.

FIG. 1A shows an equivalent circuit diagram of an $I^2L$ circuit, while FIG. 1B shows a sectional structure of the elements. As illustrated in FIG. 1A, the $I^2L$ circuit may be considered as a combination of a common base PNP transistor 11 and a common emitter NPN transistor 12. The emitter I of the transistor 11 is usually called the "injector", and a power supply is connected to this terminal. The base B of the transistor 12 is used as an input terminal, and the collectors $C_1$ through $C_3$ are used as output terminals, so as to derive multi-collector outputs. The transistor 12 is such that the emitter and collector of a conventional planar transistor are inverted, and the emitter E is grounded. The configuration described above is apparent from the sectional view of FIG. 1B.

The PNP transistor 11 is constructed of a lateral transistor, the emitter of which is formed of a P-type semiconductor region 13, the base of which is formed of an epitaxially grown semiconductor layer of N-type conductivity 14, and the collector of which is formed of a P-type semiconductor region 15. The NPN transistor 12 is constructed with the collectors formed of N-type semiconductor regions 16, the base formed of the P-type semiconductor region 15, and the emitter formed of the N-type epitaxial semiconductor layer 14. A buried layer of $N^+$-type conductivity 191 and a semiconductor region of $N^+$-type conductivity 192 serve to lead out a common ground terminal. The region 192 is also called a "collar region of $N^+$-conductivity" for preventing the influence of parasitic transistors. In addition to contacting the region 191, the region 192 is sometimes formed with a shallow portion so as to surround the $I^2L$ element.

Shown at 10 is a semiconductor substrate of P-type conductivity. The substrate 10 is a silicon (Si), substrate, and the semiconductor layer 14 is an Si epitaxial layer. The semiconductor regions 13, 15, 16, 191, and 192 are formed by thermal diffusion, ion implantation, etc.

As is seen from FIG. 1B, the collector of the PNP transistor 11 and the base of the NPN transistor 12 are formed by P-type semiconductor region 15. The base of the PNP transistor 11 and the emitter of the NPN transistor 12 are formed by the N-type epitaxial layer 14 in common.

The $I^2L$ element described above has a small occupying area, is capable of a low power operation, and is easily brought into coexistence with other functional circuits employing bipolar transistors, so that it is being applied extensively. However, when it coexists with the other functional circuits employing bipolar transistors, the area of the circuit portion other than the $I^2L$ element is large and the power dissipation thereof is high, and the features of the $I^2L$ element are often decreased along with the whole LSI.

When injector current of the $I^2L$ element must be a minute current, a current mirror circuit is often employed as current supplyng means, in order to supply a constant current. A "current mirror circuit" is a circuit which provides a current equal to a certain reference current (given current) from an output terminal. Where the current mirror circuit is constructed of a multi-collector transistor, currents which correspond to the area ratios of the respective collectors can be supplied.

A prior art current mirror circuit is shown in FIG. 2A. In this circuit, current $I_{21}$ which is derived from collectors $C_4$ and $C_5$ is equal to current $I_{22}$ which flows through a resistor R. When using this circuit as a current source for supplying a low current (approximately several $\mu A$ or less), the resistor R requires a great resistance value (several hundreds $K\Omega$ or above). With ordinary bipolar transistor processes, accordingly, a pinch resistor must be used. The pinch resistor, however, has disadvantages that the area is large, the temperature dependence is inferior, and a large margin is required for design because of large dispersion and an inferior precision.

FIG. 2B shows a plan pattern when the circuit of FIG. 2A is constructed of an integrated circuit. A P-type region 21, an N-type region 22, and P-type regions 23, 24, and 25 become the emitter, the base, and the collectors of a multi-collector PNP transistor 201, respectively. A P-type region 26, an N-type region 27, and a P-type substrate 28 become the emitter, base, and collector of a PNP transistor 202, respectively. Regions 291 and 292 (part of the one-dot chain line) are P-type and N-type regions respectively, which constitute the pinch resistor. Parts of broken lines are metallic interconnections.

As is apparent from FIG. 2B, the pinch resistor occupies most of the region of the current mirror circuit. By way of example, when a current of $1\mu A$ is to be derived from the collectors $C_4$ and $C_5$ with $V_{CC}=5V$, the resistance of the resistor R must be about $4M\Omega$. Therefore, the occupying area of the resistor part only becomes $310=180\mu m^2$, which is very unfavorable.

SUMMARY OF THE INVENTION

An object of the invention is to eliminate the disadvantage of the prior art current mirror circuit and to provide a current mirror circuit which does not employ a pinch resistor.

Another object of the invention is to provide a current mirror circuit which is constructed by exploiting an $I^2L$ element and which is suitable for use in an integrated circuit made up of a large number of $I^2L$ elements.

The subject matter of the invention resides in a current mirror circuit characterized in that an $I^2L$ element is employed as a load of the current mirror circuit made up of the PNP (NPN) transistors shown in FIG. 2A, that the injector of the $I^2L$ element is made common to those of another group of $I^2L$ elements, and that a predetermined current is derived from the PNP (NPN) transistor of the current mirror circuit.

BRIEF DESCRIPTION OF THE DRAWINGS

FIG. 1A is a circuit diagram for explaining an I²L element;

FIG. 1B is a sectional view of the structure of elements in the I²L element of FIG. 1A;

DESCRIPTION OF THE PREFERRED EMBODIMENT

Hereunder, the invention will be described in detail with reference to an embodiment.

Figure 3A:
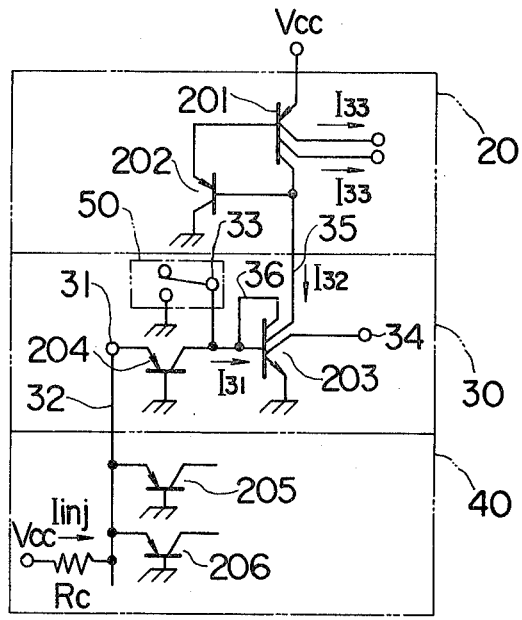
FIG. 3A is a circuit diagram showing an embodiment of the invention.
Figure 3B:
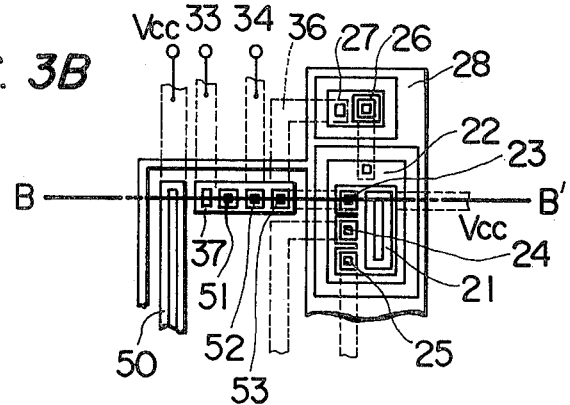
FIG. 3B is a plan pattern view of the time where the circuit of FIG. 3A is constructed of an integrated circuit.
Figure 3C:
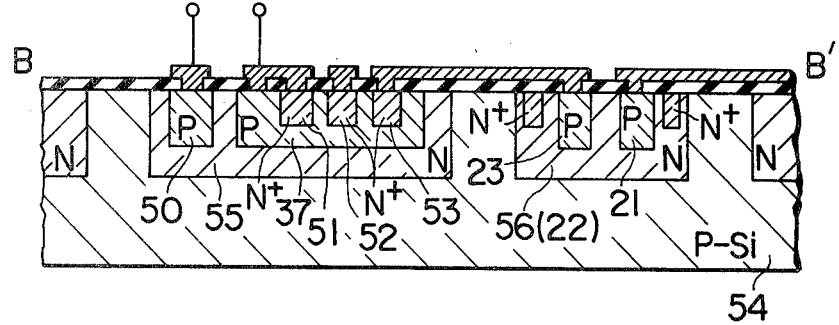
FIG. 3C is a sectional view of elements taken along line B—B' in FIG. 3B.

A current mirror circuit embodying the invention is illustrated in FIGS. 3A, 3B, and 3C.

In FIG. 3A, a broken line portion 40 is a logical circuit portion which is constructed of an I²L element. An injector current $I_{inj}$ flows from a power supply $V_{CC}$ through a resistor $R_C$ to a common injector line 32.

In FIG. 3A a broken line portion 30 is a load portion of the current mirror circuit. It constitutes the current mirror circuit together with broken line portion 20.

Figure 2A:
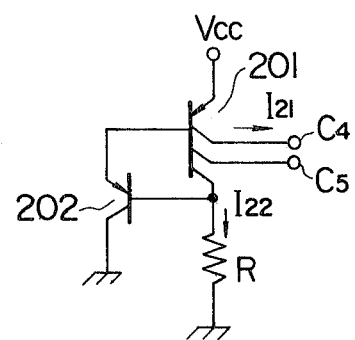
FIG. 2A is a circuit diagram for explaining a prior art current mirror circuit.

In the current mirror circuit of FIG. 3A, an I²L element which is made up of a lateral PNP transistor 204 and an inverse NPN transistor 203 is disposed in place of the resistor R of the prior art current mirror circuit in FIG. 2A. The injector of this I²L element is used in common with those of the I²L logical circuit portion. In the I²L portion 30, an output of one collector 36 of the multi-collector NPN transistor 203 is connected to the base of the transistor itself. When base terminal 33 of the I²L portion 30 is open and current is permitted to flow from an injector terminal 31, then $I_{31} = I_{32}$. Since $I_{32} = I_{33}$, $I_{31} = I_{33}$. Various merits of the present circuit are as follows:

(1) The current caused to flow to the injector 31 of the I²L portion 30 is obtained by using the injectors of another I²L portion within the same chip in common. Accordingly, it is unnecessary to employ a pinch resistor, and the area can be made smaller than in the prior art to the extent that the pinch resistor has been replaced with one stage of I²L gate.

Figure 2B:
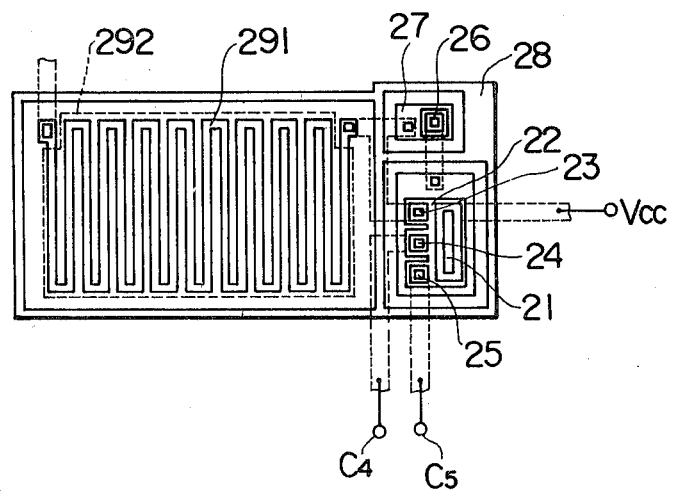
FIG. 2B is a plan pattern view where the circuit of FIG. 2A is constructed of an integrated circuit.

For example, when supplying current of 1µA under $V_{CC} = 5V$, the resistance of the resistor in the circuit of FIG. 2A is several MΩ. A plan view in the case of forming the resistor of a pinch resistor is as shown in FIG. 2B.

In contrast, a plan view of the I²L current mirror circuit according to the invention is as shown in FIG. 3B, and an area less than 1/10 of that of the resistor portion in the prior art suffices.

FIG. 3B is a plan pattern at the time when the current mirror circuit of FIG. 3A is formed into an integrated circuit, while FIG. 3C is a sectional view taken along line B—B' in FIG. 3B. In the Figures, numerals 51, 52, and 53 designate diffusion regions of N⁺-type conductivity, which form the multicollector parts of the I²L element. Numeral 50 designates a diffusion region of P-type conductivity which serves as the injector. Numeral 54 indicates a P-type semiconductor (e.g. Si) substrate, and numerals 55 and 56 indicate N-type regions which are diffused layers or epitaxially grown layers.

(2) Since the pinch resistor is not employed in the current mirror circuit portion, currents of small dispersion and high precision can be supplied.

(3) If the current $I_{33}$, which the current mirror circuit supplies is caused to flow through another I²L logical circuit different from the part 40, both the current source and the logical circuit are constructed of I²L circuits. Accordingly, current balance is easily obtained, and circuit design is conspicuously facilitated. The current mirror circuit 20 of PNP transistors and the I²L element 30 can have currents set at desired magnitudes by varying the areas of the collectors of the respective transistors, i.e. PNP transistor 201 and NPN transistor 203. By way of example, the areas of the collectors 51 and 53 are made equal, and the area of the collector 25 is made double that of the collector 23. Alternatively, the area of the collector 53 is twice that of the collector 51, and the areas of the collectors 23 and 25 are equal. At this time, it holds that $I_{33} = 2I_{31}$.

(4) By controlling the voltage of the base terminal 33 in FIG. 3A, the currents $I_{33}$ can be switched. By way of example, when the terminal 33 is grounded by the use of a switching element or switching circuit 50, the I²L element 30 is cut off, and the current mirror circuit is also cut off. The switching element or switching circuit 50 sets the potential of the terminal 33 at the open state or the ground state. Accordingly, it is not necessary to cause any unnecessary current to flow, and the power dissipation of the circuit can be decreased.

(5) By adding a collector terminal 34 to the I²L element, the circuit can be operated while monitoring the currents.

As explained above, the current mirror circuit of the invention is very useful as a minute current source of small area and high precision. According to the invention, the current mirror circuit can be provided by making the best use of the great merit of the I²L element that the area of the device is small.

It is also possible to change the polarities of voltages by making the transistors 201, 202, and 204 NPN transistors and the transistor 203 a PNP transistor conversely to the foregoing embodiment.

While we have shown and described one embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed:

1. A current mirror circuit comprising;
    a first transistor which has a plurality of collectors, in which the output of a first one of said collectors is fed back to the base of said first transistor, in which an output current is derived from a second one of said collectors, and the emitter of which is connected to a power supply;
    a second transistor which has a plurality of collectors, in which the output of a first one of said collectors is fed back to the base of said second transistor, in which a second one of said collectors is connected to the first collector of said first transistor, and the emitter of which is grounded;

a third transistor the base of which is grounded, the collector of which is connected to the base of said second transistor, and the emitter of which serves as a current supplying terminal; and wherein said first collector output of said first transistor is fed back to the base thereof through a fourth transistor, the collector of which is grounded, the base of which is connected to said first collector of said first transistor, and the emitter of which is connected to the base of said first transistor.

2. A current mirror circuit according to claim 1, wherein said first and fourth transistors are PNP transistors, said second transistor is an NPN transistor, said third transistor is a lateral PNP transistor, said second and third transistors forming an I$^2$L element, and the emitter of said third transistor serving as the injector of said I$^2$L element being constructed in common with the injector of a logical circuit containing the I$^2$L element.

3. A current mirror circuit according to claim 1, wherein the base of said second transistor is provided with a switching element which is connected to one of a ground terminal and an open terminal.

4. A current mirror circuit according to claim 1, wherein the area of the second collector of said second transistor is n times (wherein n is a positive integer or a fraction) as large as the area of the first collector thereof, and the area of the second collector of said first transistor is m times (wherein m is a positive integer or a fraction) as large as the area of the first collector thereof, whereby current to be derived from the second collector of said first transistor is n×m times as high as the base current of said second transistor.

5. A current mirror circuit according to claim 1, wherein said second transistor is an NPN transistor, said third transistor is a lateral PNP transistor, an I$^2$L element is constructed of said second and third transistors, and the emitter of said third transistor to serve as an injector of said I$^2$L element is constructed in common with the injector of an I$^2$L logical circuit.

* * * * *